United States Patent [19]
Bauer et al.

[11] Patent Number: 5,377,911
[45] Date of Patent: Jan. 3, 1995

[54] APPARATUS FOR PRODUCING CRYOGENIC AEROSOL

[75] Inventors: Tibor L. Bauer, Hopewell Junction; William A. Cavaliere, Verbank, both of N.Y.; Charles R. Dart, II, Coral Springs, Fla.; Timothy H. Freebern, LaGrangeville, N.Y.; David C. Linnell, Poughkeepsie, N.Y.; James M. Miller, Pawling, N.Y.; Jin J. Wu, Ossining, N.Y.

[73] Assignee: International Business Machines Corporation, Armonk, N.Y.

[21] Appl. No.: 76,052

[22] Filed: Jun. 14, 1993

[51] Int. Cl.⁶ .................. B05B 1/26; F17C 7/02
[52] U.S. Cl. ........................ 239/135; 239/128; 62/51.1
[58] Field of Search .............. 239/13, 128, 135, 139, 239/390, 600; 134/105, 902; 51/319, 320, 321, 322, 410, 417, 421, 426, 436, 439; 62/50.1, 50.7, 51.1, 64, 303, 320, 347

[56] References Cited

U.S. PATENT DOCUMENTS

| | | | |
|---|---|---|---|
| 1,941,304 | 12/1893 | Heylandt | 226/119 |
| 3,302,419 | 2/1967 | Walter | 62/55 |
| 3,729,946 | 5/1973 | Massey | 62/50.1 |
| 4,296,610 | 10/1981 | Davis | 62/50.1 |
| 4,617,064 | 10/1986 | Moore | 134/7 |
| 4,631,250 | 12/1986 | Hayashi | 430/329 |
| 4,715,187 | 12/1987 | Stearns | 62/50.1 |
| 4,747,421 | 5/1993 | Hayashi | 134/201 |
| 4,806,171 | 2/1989 | Whitlock et al. | 134/7 |
| 4,854,128 | 8/1989 | Zeamer | 62/50.1 |
| 4,870,838 | 10/1993 | Zeamer | 62/51.1 |
| 4,932,168 | 6/1903 | Tada et al. | 51/436 |
| 4,962,891 | 10/1990 | Layden | 51/320 X |
| 4,977,910 | 12/1990 | Miyahara et al. | 134/7 |
| 5,001,873 | 3/1991 | Rufin | 51/320 |
| 5,009,240 | 4/1991 | Levi | 134/7 |
| 5,018,667 | 5/1991 | Lloyd | 239/132.5 |
| 5,025,632 | 6/1991 | Spritzer | 62/64 |
| 5,062,898 | 11/1991 | McDermott et al. | 134/7 |
| 5,108,512 | 4/1992 | Goffnett et al. | 134/7 |
| 5,125,979 | 6/1992 | Swain et al. | 134/7 |
| 5,136,605 | 8/1992 | Basting et al. | 372/59 |
| 5,142,874 | 9/1992 | Maric | 62/50.1 X |
| 5,147,466 | 9/1992 | Ohmori et al. | 134/7 |
| 5,209,028 | 5/1993 | McDermott et al. | 51/426 |

OTHER PUBLICATIONS

IBM TDB vol. 26, No. 1, Jun. 1983, pp. 233–234.
IBM TDB vol. 26, No. 6, Nov. 1983, pp. 2721–2723.
"Multilayer Insulation (MLI) in the Super conducting Super Collider-Practical Engineering Approach to Physical Parameters Governing MLI Thermal Performance", by J. D. Gonczy, et al. Fermi National Accelerator Laboratory.

*Primary Examiner*—Andres Kashnikow
*Assistant Examiner*—Lesley D. Morris
*Attorney, Agent, or Firm*—Richard Lau

[57] ABSTRACT

An apparatus for producing aerosol from a substance includes a heat exchanger for receiving and cooling a substance. The heat exchanger includes a housing; a cryogenic reservoir comprising a solid material mounted within the housing; temperature control means for controllably cooling the reservoir; and energy exchange means for allowing thermal contact between the reservoir and the substance for effectuating transfer of cooling energy from the cryogenic reservoir to the substance for controllably cooling the substance. A delivery line has an inlet for receiving the substance from the heat exchanger at a first pressure. A nozzle is connected to the delivery line for receiving the substance from the delivery line. The nozzle has at least one exit opening which allows passing of the substance therethrough for expanding the substance from the first pressure to a second pressure which is lower than the first pressure for solidifying the substance and producing aerosol. Condensation preventing means is provided for preventing condensation from forming on the delivery line and/or on the nozzle.

38 Claims, 9 Drawing Sheets

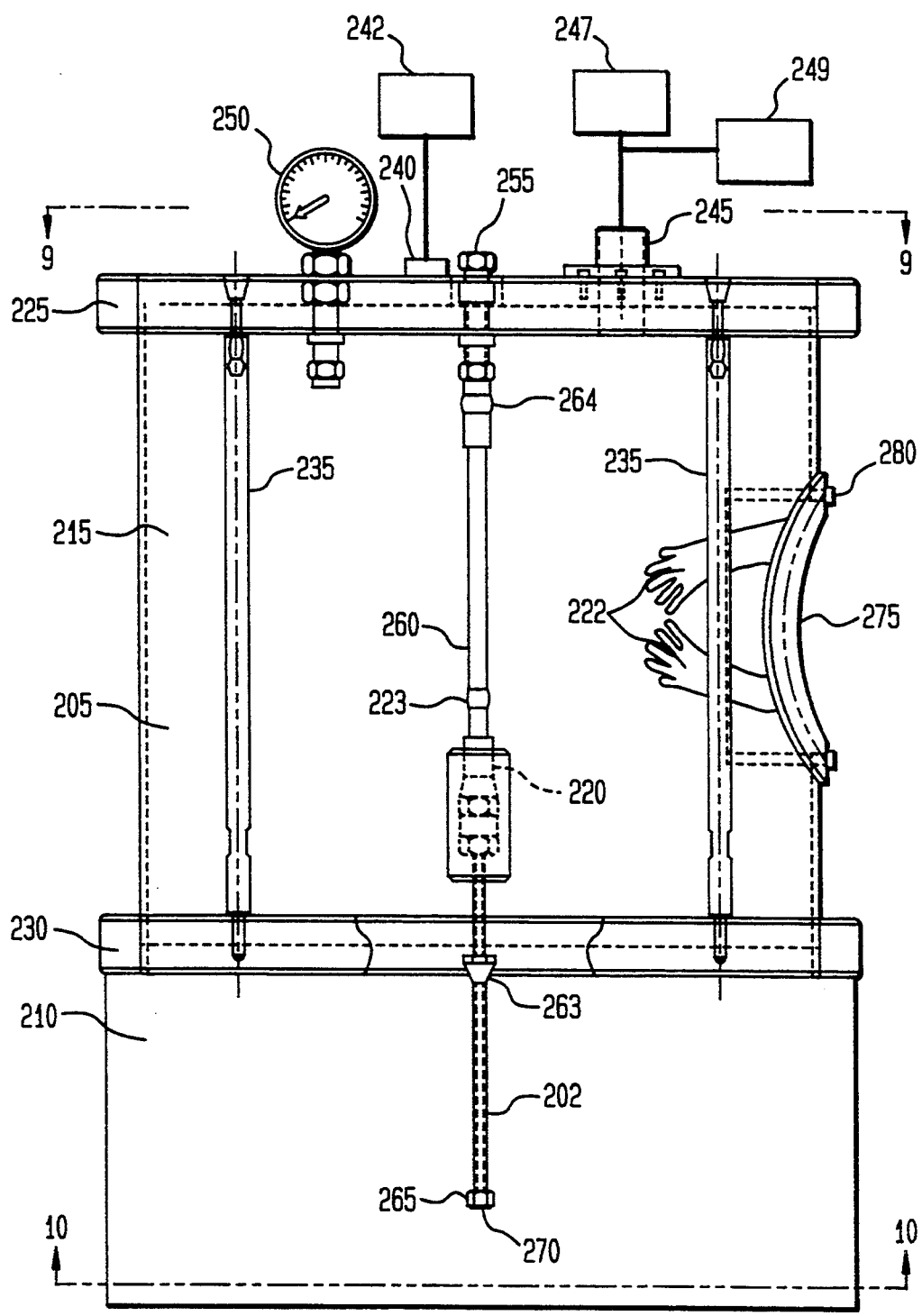

APPARATUS FOR PRODUCING CRYOGENIC AEROSOL

This patent application is related to the following commonly assigned, simultaneously filed, patent applications:

U.S. Ser. No. 08/076,053, Docket No. FI9-93-032, filed on Jun. 14, 1993, pending;
U.S. Ser. No. 08/076,065, Docket No. FI9-93-033, filed on Jun. 14, 1993, pending;
U.S. Ser. No. 08/076,051, Docket No. FI9-93-031, filed on Jun. 14, 1993, pending; and
U.S. Ser. No. 08/076,064, Docket No. FI9-93-026, filed on Jun. 14, 1993, pending.

TECHNICAL FIELD

The present invention relates generally to production of cryogenic aerosol and, more particularly, to surface cleaning using a cryogenic aerosol.

BACKGROUND OF THE INVENTION

Surface contamination is a widespread concern in many industries. Such contamination can result in production of inferior or non-operating products, or considerably lower product yields. For instance, as a specific example, surface contamination is a prevalent problem in the microelectronics processing industry, and can take the form of unwanted particles, films, molecules, or the like; and the surfaces that can be contaminated include those of semiconductor wafers, displays, microelectronic components, etc. Contamination of these surfaces can cause various types of defects to develop, including short circuits, open circuits, stacking faults, among others. These defects can adversely affect circuits, and ultimately cause entire chips to fail.

Another type of surface that has contaminants that are required to be removed are the walls of tool or processing chambers, such as plasma etch and chemical vapor deposition reactors. Reaction residues and/or polymers generaten during semiconductor processing tend to deposit on the chamber walls. These residues and/or polymers can subsequently flake off onto products being processed or onto subsequently processed products. In order to prevent yield loss due to this mechanism, manufacturing processing chambers have to be disassembled periodically to be cleaned or "wiped down". Current practice involves weekly disassembly of the fixtures inside the chamber and wipe down of all the surfaces with a mixture of alcohol and water. This periodic machine disassembly, wipe down, and re-assembly, and the required long pump-down times after cleaning for surface drying, severely reduces the production and reliability of the processing equipment. In addition, the acidic fumes formed when the deposited material reacts with water often creates a health hazard for cleaning personnel.

U.S. Pat. No. 5,108,512, issued Apr. 28, 1992, to Goffnett et al., relates to cleaning a chemical vapor deposition reactor used in the production of polycrystalline silicon by impacting with carbon dioxide pellets. Goffnett et al. discloses delivering carbon dioxide gas to a pelletizer where the gas is compressed and formed into solid carbon dioxide pellets. The pellets, along with an accelerant gas for increasing the velocity of the pellets, are delivered to a nozzle. The nozzle is a "venturi" nozzle which maximizes the velocity at which the pellets are emitted therefrom. Further, the nozzle is mounted on a conveyor arm which allows movement of the nozzle. Disadvantages associated with the Goffnett et al. apparatus include the requirement of a pelletizer, and the mounting of the nozzle on a conveyor arm for movement of the nozzle. More specifically, the conveyor arm arrangement limits mobility of the nozzle since the nozzle can only be moved in accordance with the configuration of the conveyor arm.

Another form of cleaning includes chemical cleaning which is used for cleaning particulate and/or film contaminants from surfaces, such as wafers and substrates. Chemical cleaning involves using a solvent or liquid cleaning agent to dislodge or dissolve contaminants from the surface to be cleaned. A disadvantageous associated with chemical cleaning methods is that the cleaning agent must be maintained with a high degree of cleanliness and purity. Thus, a high quality agent is required, and the agent must be replaced periodically as it becomes progressively more contaminated during cleaning. The replaced chemicals require disposal and cause environmental degradation. Accordingly, it is difficult and expensive to appropriately and effectively implement chemical cleaning methods.

U.S. Pat. No. 5,062,898, issued Nov. 5, 1991, to McDermott et al., and commonly assigned to a co-assignee of the present invention, relates to a method of cleaning microelectronics surfaces using an aerosol of at least substantially solid argon particles which impinge upon the surface to be cleaned.

U.S. application Ser. No. 07/970,346, filed Nov. 2, 1992, allowed Oct. 29, 1993, and commonly assigned to a co-assignee of the present invention, relates to a method of cleaning microelectronics surfaces using an aerosol of at least substantially solid argon or nitrogen particles which impinge upon the surface to be cleaned.

U.S. application Ser. No. 07/958,417, filed Oct. 9, 1992, issued on May 11, 1993 as U.S. Pat. No. 5,209,028 and commonly assigned to a co-assignee of the present invention, relates to an apparatus capable of executing the process of cleaning with a cryogenic aerosol as described in U.S. Pat. No. 5,062,898 or U.S. application Ser. No. 07/970,346 filed Nov. 2, 1992, allowed Oct. 26, 1993.

SUMMARY OF THE INVENTION

Generally, the present invention relates to an apparatus for producing aerosol from a substance. The apparatus includes a heat exchanger for receiving and cooling a substance. The heat exchanger includes a housing; a cryogenic reservoir comprising a solid material mounted within the housing; temperature control means for controllably cooling the cryogenic reservoir; and energy exchange means for allowing thermal contact between the reservoir and the substance for effectuating transfer of cooling energy from the cryogenic reservoir to the substance for controllably cooling the substance. A delivery line has an inlet for receiving the substance from the heat exchanger at a first pressure. A nozzle is connected to the delivery line for receiving the substance from the delivery line. The nozzle has at least one exit opening which allows passing of the substance therethrough for expanding the substance from the first pressure to a second pressure which is lower than the first pressure for solidifying the substance and producing aerosol. Condensation preventing means is provided for preventing condensation from forming on the delivery line and/or on the nozzle.

BRIEF DESCRIPTION OF THE DRAWINGS

These and other objects, features, aspects and advantages will be more readily apparent and better understood from the following detailed description of the invention, in which:

FIG. 8 is a cross-sectional view of another embodiment of an apparatus for cleaning a surface in accordance with the present invention;

DETAILED DESCRIPTION OF THE PREFERRED EMBODIMENT

Figure 1:
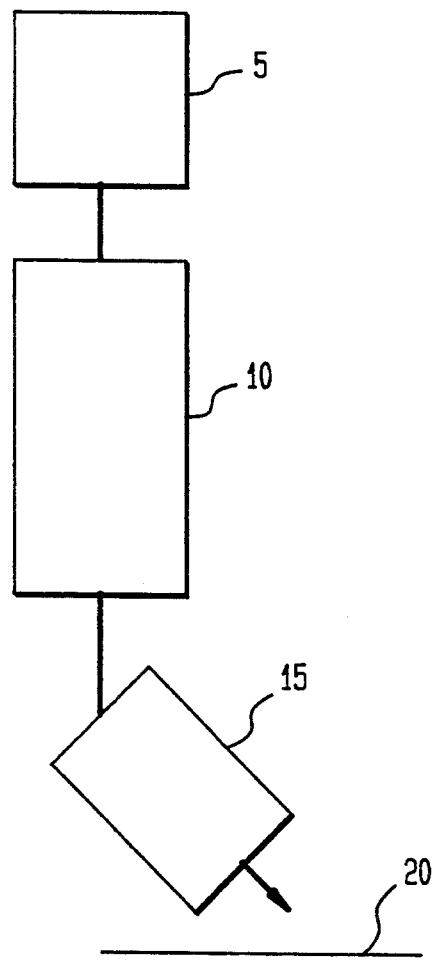
FIG. 1 shows an overall schematic illustration of an aerosol cleaning apparatus.

Generally, aerosol cleaning of contaminated surfaces is accomplished through a process of colliding cryogenic particles at high velocity against the surface to be cleaned. The cryogenic aerosol particles strike contaminating particles, films and molecules located on the surface. The collision imparts sufficient energy to the contaminant so as to release it from the surface. The released contaminant becomes entrained in a gas flow and is vented. The gaseous phase of the aerosol impinges against the surface and flows across the surface, thus forming a thin boundary layer. The contaminating material usually exist within the low velocity boundary layer. Therefore, the gas phase alone cannot remove small contaminants because of insufficient shearing force. However, the cryogenic aerosol particles have significant inertia and are thus able to cross through the boundary layer to the surface.

Cryogenic aerosol particles tend to decelerate as they pass through the boundary layer toward the surface. In order for cleaning to occur, the aerosol particles must traverse the boundary layer and strike the surface. A simple model assumes that the gas flow creates a boundary layer of thickness "h" having a negligible normal component of velocity. In order to strike the surface, the solidified cryogenic aerosol particles must enter the boundary layer within a normal component of velocity equal to at least "h/t". The particle relaxation time "t" is given by:

$$t = 2a^2 \rho_p C / 9 \mu$$

where "a" is the cryogenic aerosol particle radius, "$\rho_p$" is the particle density, "$\mu$" is the dynamic viscosity of the gas, and "C" is the Stokes-Cunningham slip correction factor which is given by:

$$C = 1 + 1.246(\lambda/a) + 0.42(\lambda/a) \exp[-0.87(a/\lambda)]$$

where "$\lambda$" is the mean free path of the gas molecules which is inversely proportional to the gas pressure.

The above analysis shows that the effectiveness of the cleaning process is dependent on the size of the cryogenic aerosol particles. The cleaning process is more effective for cryogenic aerosol particles having large mass or high initial velocity. However large aerosol particles have high potential of damaging delicate structures on the surface to be cleaned, such damage including pitting, cracking, dislocations, and/or stress. Further, large size cryogenic aerosol particles cannot penetrate into the depression area or trenches of the structures to remove contaminants effectively.

The cryogenic aerosol particles are formed during an expansion process. The temperature drop associated with the expansion causes gaseous or liquid species to nucleate and condense into at least substantially solid particles. The nucleation occurs when the gas/liquid vapor becomes saturated, with a partial pressure exceeding the equilibrium vapor pressure. The stable size of the nuclei formed during this process is given by:

$$a = 2 \sigma v_1 / kT \ln S$$

where "$\sigma a$" is the surface tension; "$v_1$" is the molecular volume of the nucleating species; "k" is the Boltzmann constant; and "T" is the temperature in which the nucleation occurs. "S" is the saturation ratio of the condensible species reached during the expansion and cooling. A rapid condensation and growth from the diffusion of the vapor molecules onto the nuclei occurs simultaneously to enhance the size of the cryogenic aerosol particle.

The above analysis demonstrates that it is essential to control the expansion parameters, such as the pressure and the temperature of the gaseous or liquid species, prior to and after expansion in order to produce desired cryogenic aerosol particles for achieving damage-free cleaning performance.

Inert substances that have been found effective for producing cryogenic aerosol for cleaning various surfaces include carbon dioxide, argon and nitrogen.

Referring initially to FIG. 1, an apparatus capable of producing a cryogenic aerosol for cleaning or "sandblasting" a contaminated surface includes a source 5 of gas, liquid or gas/liquid from which aerosol is produced. The substance that is supplied by the source 5 should be a substance which is not harmful to the surface 20 to be cleaned and should produce aerosol having a degree of purity in accordance with the required cleanliness of the surface 20. For instance, wafers in microelectronics processing are required to be highly clean and, thus, a highly pure aerosol may be required for cleaning such wafers; whereas, plasma tool chambers may not require as high a degree of cleanliness and, accordingly, the aerosol used for cleaning plasma tool chambers may not be required to be as highly pure as that used for cleaning wafers.

Generally, although aerosol produced from gas, liquid or gas/liquid are each capable of cleaning various contaminated surfaces, it is preferable to produce aerosol from gas when higher purity aerosol is required, and to produce aerosol from liquid or gas/liquid when relatively lower purity aerosol is required. In this regard, a heat exchanger 10 is required when producing aerosol from gas, but is not required when producing aerosol from cryogenic liquid or gas/liquid and, thus, it is generally less expensive to produce aerosol from cryogenic liquid or gas/liquid.

As mentioned hereinabove, inert substances that have been found effective for producing aerosol for cleaning various surfaces include carbon dioxide, argon and nitrogen. For example, an at least substantially solid argon particle-containing aerosol produced from argon gas has been found effective for cleaning silicon wafers. The argon gas can be used alone or mixed with ultra-pure nitrogen gas, in which case the nitrogen can be made to remain in the gaseous phase and serve as a carrier to impart high velocities to the solid argon particles that will be produced. Mixing nitrogen with argon also allows for higher expansion ratios so as to enhance the Joule-Thompson effect and permit increased cooling. The nitrogen gas may also serve as a diluent for producing different sizes of argon aerosol particles when it is mixed with argon prior to expansion. These gases may be mixed and, optionally, filtered and/or cooled to some extent prior to being delivered to the heat exchanger 10 for further cooling.

As a further example, aerosol produced from carbon dioxide liquid, argon liquid, or nitrogen liquid has been found effective for cleaning plasma tool chambers. It should be emphasized that when producing aerosol from liquid or gas/liquid, the substance is fed directly to nozzle 15, i.e., without passing through the heat exchanger 10.

When producing aerosol from gas, a gas is fed from the source 5 to the heat exchanger 10, which will be explained in greater detail hereinafter. Generally, the heat exchanger 10 cools the gas to near its liquefaction or solidification point, i.e., within about 5-20 degrees F. above its gas to liquid and/or solid transition temperature; however, it is important that the majority of the gas should be maintained in a gaseous state through the heat exchanger 10. The heat exchanger 10 may also serve as an impurity trap to remove condensable impurities from the gas passing therethrough. Typically, the cooled gas, for example, argon gas, has a temperature on the order of approximately −190 degrees F. to −300 degrees F., at a pressure on the order of approximately 20 psig to 690 psig, and preferably a temperature of between approximately −250 degrees F. and −300 degrees F., and a pressure of between approximately 20 psig and 100 psig.

Subsequently, the substance, which may be the cooled gas from the heat exchanger 10 or the liquid or gas/liquid directly from the source 5, is fed to a nozzle 15, wherein the substance is adiabatically expanded to a lower pressure so that at least a substantial portion of the substance solidifies, and is directed at the surface 20 to be cleaned. The nozzle 15 will be explained in greater detail hereinafter. The pressure of the expanded substance may range from high vacuum to greater than atmospheric pressure. This expansion effectuates Joule-Thompson cooling of the substance so as to cause, preferably, solidification thereof and thus production of an aerosol. However, although it is preferable that solidification of the substance occurs, a portion of the substance may instead liquify or remain liquid. In this regard, the surface 20 may still be effectively cleaned if at least a substantial portion of the substance forms into solid particles, and the remainder of the substance remains as liquid.

Gas will directly form solid particles, i.e., without first forming liquid droplets, if the gas is pressurized to a point below its triple point. If the gas is not pressurized to a point below its triple point, then the gas may condense into liquid droplets and either remain liquid or, if the pressure drop was adequate, subsequently freeze into solid particles. By way of example, the triple point of argon gas is at 9.99 psia, at −308.9 degrees F. Further, liquid will form solid particles with sufficient cooling thereof.

Figure 2:
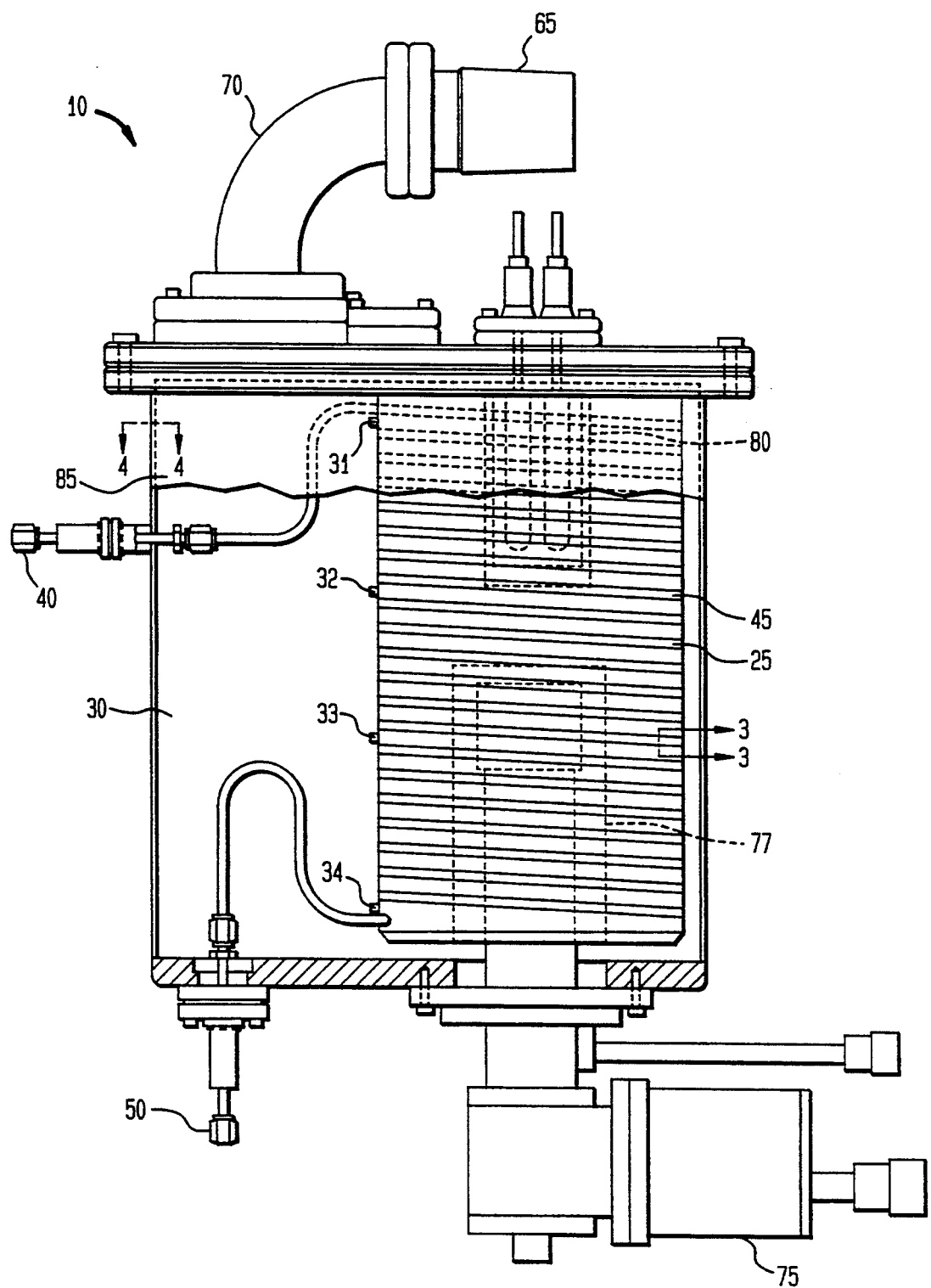
FIG. 2 is a partial cross-sectional view of a heat exchanger in accordance with the present invention.

Referring now to FIG. 2, there is shown a heat exchanger 10 capable of providing the cooling requirements as outlined above. The heat exchanger 10 includes a cryogenic reservoir 25 mounted within a housing 30. Since the cryogenic reservoir 25 can be mounted within the housing 30 by any of a number of conventional means, such conventional means is not snown or discussed in detail herein. However, for maximizing efficiency, the cryogenic reservoir 25 is preferably not in contact with the interior walls of the housing 30. In this regard, the cryogenic reservoir 25 can be isolated from the interior walls of the housing 30 by positioning appropriate insulating material therebetween.

Preferably, the cryogenic reservoir 25 comprises a solid material, and in order for the heat exchanger 10 to be effective and efficient in allowing for gas temperature to be accurately controlled, for instance, to within 2–3 degrees F. of the desired temperature, the cryogenic reservoir 25 should comprise a material having high thermal conductivity, a relatively large specific heat value, and adequate size or mass. Issues regarding manufacturability should also be considered, for example brazing. The type of material used and its required mass is determined by the cooling energy requirements and allowable temperature fluctuation of the cryogenic reservoir 25 during the production of aerosol. For example, it has been found that a copper block having a mass of approximately 239 lbs has the necessary properties for serving as the cryogenic reservoir 25 for certain applications. The temperature at which the cryogenic reservoir 25 must be maintained is a function of the operating pressure of the gas. Typically, the cryogenic reservoir 25 is maintained at a temperature of between about −260 degrees F. and −300 degrees F. The higher the operating pressure of the gas, the higher the temperature at which the reservoir 25 must be maintained, and vice versa. Four thermal sensors 31–34 are positioned along the length of the cryogenic reservoir 25 to monitor the temperature of the cryogenic reservoir 25, and the temperature readings taken therefrom are used for controlling or regulating the temperature of the gas.

The gas to be cooled enters at inlet 40, passes through tubing 45 for cooling, and the cooled gas exits at outlet 50. The tubing 45 should be of adequate length and suitable diameter to allow the gas passing therethrough to adequately cool to the required temperature as it approaches outlet 50. As an example, the tubing 45 can comprise stainless steel, or other appropriate material, and have an outside diameter of 3/8 inch and a length of approximately 32 feet; wherein it has been found possible to cool gas to within about 2–3 degrees F. of the temperature of the cryogenic reservior 25 within the first 24 feet of the tubing 45. The gas is maintained at this temperature as it passes through the remaining length of the tubing 45.

Further, the interior surfaces of the tubing 45 should be adequately clean so that the gas passing therethrough is not contaminated. For example, the interior surfaces of the tubing 45 can be chemically cleaned and electropolished by conventional processes.

The tubing 45 should be in adequate thermal contact with the cryogenic reservoir 25 so that the cooling energy of the cryogenic reservoir 25 can be effectively and efficiently passed or transferred to the gas via the tubing 45. In this regard, in order to effectuate the transfer of the cooling energy, it is preferable that at least a portion of the tubing 45, along its entire length, be in physical contact or at least in close physical proximity to the cryogenic reservoir 25 so that the gas passing through the tubing 45 is also in close physical proximity to the cryogenic reservoir 25. As such, the heat energy of the gas is exchanged with the cold energy of the cryogenic reservoir 25, via the tubing 45, and the gas is thus cooled.

Figure 3:
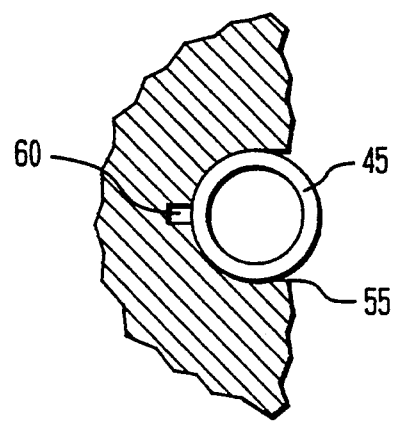
FIG. 3 is a cross-sectional view of a portion of the heat exchanger of FIG. 2.

FIG. 3 shows one example of how the tubing 45 can be positioned and located for providing adequate thermal contact with the cryogenic reservoir 25. Specifically, a spiral radial groove 55 is machined in and around the cryogenic reservoir 25. The groove 55 should be of suitable dimension for receiving the tubing 45 so that, preferably, a substantial portion of the tubing 45 can be in contact, or within brazed contact, with the cryogenic reservoir 25 within the groove 55. Optionally, a notch 60 can also be cut within the groove 55 and along the entire length of the groove 55.

For assembly, brazing wire is positioned into the notch 60, and the tubing 45 is swaged into the groove 55 around the cryogenic reservoir 25. More brazing wire is then positioned along the length of the tubing 45 outside of the groove 55. The cryogenic reservoir 25, along with the tubing 45 and brazing wire, is then placed, for example, into a vacuum curing oven so that the brazing wire can be melted to form bond between the tubing 45 and the cryogenic reservoir 25. More specifically, the brazing wire in the notch 60 melts and fills the notch 60 and provides a bond for the tubing 45; and the brazing wire positioned along the length of the tubing 45 outside of the groove 55 melts and flows between the tubing 45 and the inside of the groove 55 so as to form a bond therebetween. The tubing 45 should be adequately bonded to the cryogenic reservoir 25 so that there is sufficient thermal contact therebetween, thus allowing for efficient exchanging or transferring of cooling energy from the cryogenic reservoir 25 to the gas via the tubing 45.

In order to achieve the required temperatures and stability as specified hereinabove, the cryogenic reservoir 25 and tubing 45, and the gas within the tubing 45, are isolated from convection and conduction heat input and radiation heat load, or cold energy loss therefrom, by being located within a housing 30 insulated by suitable insulation means. For example, the insulation means can comprise layered insulation means which surrounds the components within the housing 30 and/or the housing 30 itself; and the insulation means can further comprise vacuum insulation means which evacuates molecules from the housing 30.

Figure 4:
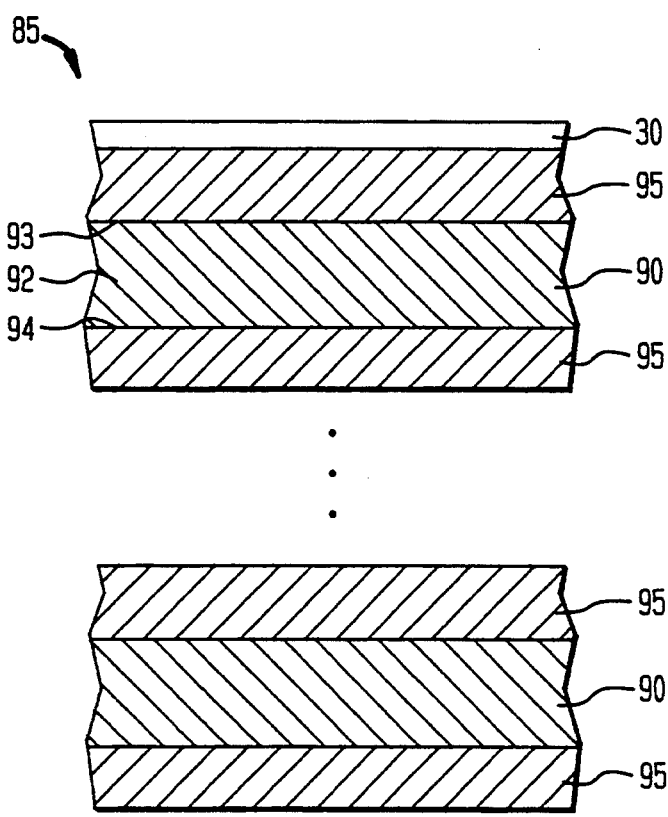
FIG. 4 is a cross-sectional view of insulation used in the heat exchanger of FIG. 2.

As an example, the layered insulation means comprises material which surrounds or is wrapped around the housing 30. Such material should be capable of lowering radiation heat load and serving as a barrier for impeding conduction. In a preferred embodiment, concepts disclosed in the "Multilayer Insulation (MLI) in the Superconducting Super Collider—a Practical Engineering Approach to Physical Parameters Governing MLI Thermal Performance", by J. D. Gonczy, W. N. Boroski, and R. C. Niemann, Fermi National Accelerator Laboratory, March 1989, and presented by J. D. Gonczy at the 1989 International Indistrial Symposium on the Super Collider, in New Orleans, La., Feb. 8–10, 1989, are used for constructing the layered insulation means of the present invention. In accordance with these concepts, the layered insulation means can comprise a multilayered blanket 85, a top view, cross-sectional portion of which is illustrated in FIG. 4. The multilayered blanket 85 has alternating layers of reflective layers 90 and spacer layers 95, with the multilayered blanket 85 beginning and ending with a spacer layer 95. The reflective layers 90 each have a middle portion 92 comprising material having low emissivity so as to function as a barrier to conduction. The middle portion 92 of each reflective layer 90 is "sandwiched" between two end layers 93 and 94. Each end layer 93, 94 comprises material capable of reflecting thermal energy. The spacer layers 95 function to distance the reflective layer 90 from one another, thus encapsulating the end layers 93, 94 so that heat is not directly transferred from one reflective layer 90 to the next reflective layer 90. The specific total number of alternating reflective and spacer layers required for the multilayered blanket 85 to function effectively depends on the particular application for which it is being used. Generally, the heat flux through the blanket 85 varies inversely with the number of reflective layers 90 implemented, and is a function of the density or number of reflective layers 90 per unit thickness of the blanket 85. As a specific example, in order to provide a blanket 85 effective for functioning as layered insulating means for aerosol production in the temperature ranges specified hereinabove, it has been found adequate to alternatingly stitch together 21 spacer layers 95 between 20 reflective layers 90, with each reflector layer 90 having an emissivity of less than about 0.03 and a thickness of about ¼ mil, and the middle portion 92 thereof comprising polyester, and each end layer 93, 94 thereof comprising an aluminized metal coating having a thickness of about 350 Angstroms, and each spacer layer 95 having a thickness of about 4 mil, a density of about 0.5 oz/yd$^2$, and comprising polyethylene terepththalate or spunbonded polyester.

Illustratively, a pump 65 can be provided for evacuating gas molecules from the housing 30 so as to attain high vacuum therein, for example, on the order of about $1\times10^{-4}$ torr. As a specific example, the pump 65 can be a Turbo-V60 Turbomolecular Pump, No. 969-9002, commercially available from Varian Vacuum Products, Lexington, Mass. However, other commercially available pumps can also be used for achieving the desired vacuum level. Further, for increased cooling efficiency, the pump 65 can be mounted on a 90 degree elbow 70 so that the mouth of the pump 65 is not pointing directly into the interior of the housing 30. In this regard, the 90 degree elbow 70 minimizes transfer into the housing 30 of any heat that may be generated by the pump 65 during operation.

Cooling means 75, such as a cold head, having cooling elements 77 extending into the housing 30, and preferably into and/or in contact with the cryogenic reservoir 25, is provided for cooling the cryogenic reservoir 25 to the desired temperature. The cooling means 75 can be any commercially available cooling unit capable of cooling the reservoir 25 at a constant rate until the desired temperature is reached. For example, a Balzers Model VHC 150 Cryogenic Refrigerator, commercially available from Balzers, Hudson, N.H., is a closed cycle refrigerator capable of delivering 200 watts of power at 77 degrees K. This allows the cryogenic reservoir 25, comprising the 239 lb copper block, to be cooled from room temperature to 77 degrees K. in approximately 9 hours, with the minimum temperature being approximately 24 degrees K. This heat exchanger 10 allows for large heat loads of gas to be maintained within a small variation of a desired low temperature. For example, it has been found that with a process heat load of approximately 1200 Watts/minute, the output temperature of the gas can be maintained and controlled to within $+/-1$ degree F. of a desired temperature.

Further, heating means, such as a conventional heat source (not shown) having heating rods 80 extending into the housing 30, and preferably into or in contact with the cryogenic reservoir 25, can also be provided for precisely maintaining the cryogenic reservoir 25 at a desired temperature. The cold head and/or heat source can be cycled on and off for such a purpose. In this regard, the cryogenic reservoir 25 can also be maintained at a desired temperature without the heating means by appropriately cycling the cold head on and off.

Additionally, it should be apparent that the heat exchanger 10 of the present invention can be used as a heating device, instead of a cooling device, if heating means is implemented in lieu of the cooling means 75. Heat sources that are currently commercially available can be used for such purpose. In such case, the reservoir 25 can be referred to as a heat reservoir rather than a cryogenic reservoir.

Moreover, the apparatus of the present invention can function as a heat exchanger and/or purifier or impurity trap. While gas is reduced to low temperatures within the tubing 45, any impurities that are contained in the gas that has a transition temperature above the holding temperature will condense onto the interior walls of the tubing 45. This is also true for liquids passed through the tubing 45. In this regard, it should also be noted that when functioning as an impurity trap, regeneration means should also be included for desorbing the impurities that condense onto the interior walls of the tubing 45. In this regard, heating means, such as the conventional heat source (not shown) having the heating rods 80 extending into the housing 30, can be used to bring the temperature of the cryogenic reservoir 25 above the transition temperature of the impurities, and the desorbed impurities can then be "purged" out of the tubing 45.

Subsequent to being cooled by the heat exchanger 10, the gas is delivered to the nozzle 15 which effectuates aerosol production, and directs the aerosol to the surface 20 to be cleaned. The nozzle 15 should be capable of efficiently providing the required Joule-Thompson cooling of the gas so as to solidify at least a substantial portion of the gas for production of the aerosol. In accordance with the invention, various means of mounting the nozzle 15 can be implemented depending on the particular application and surface being cleaned.

Figure 5:
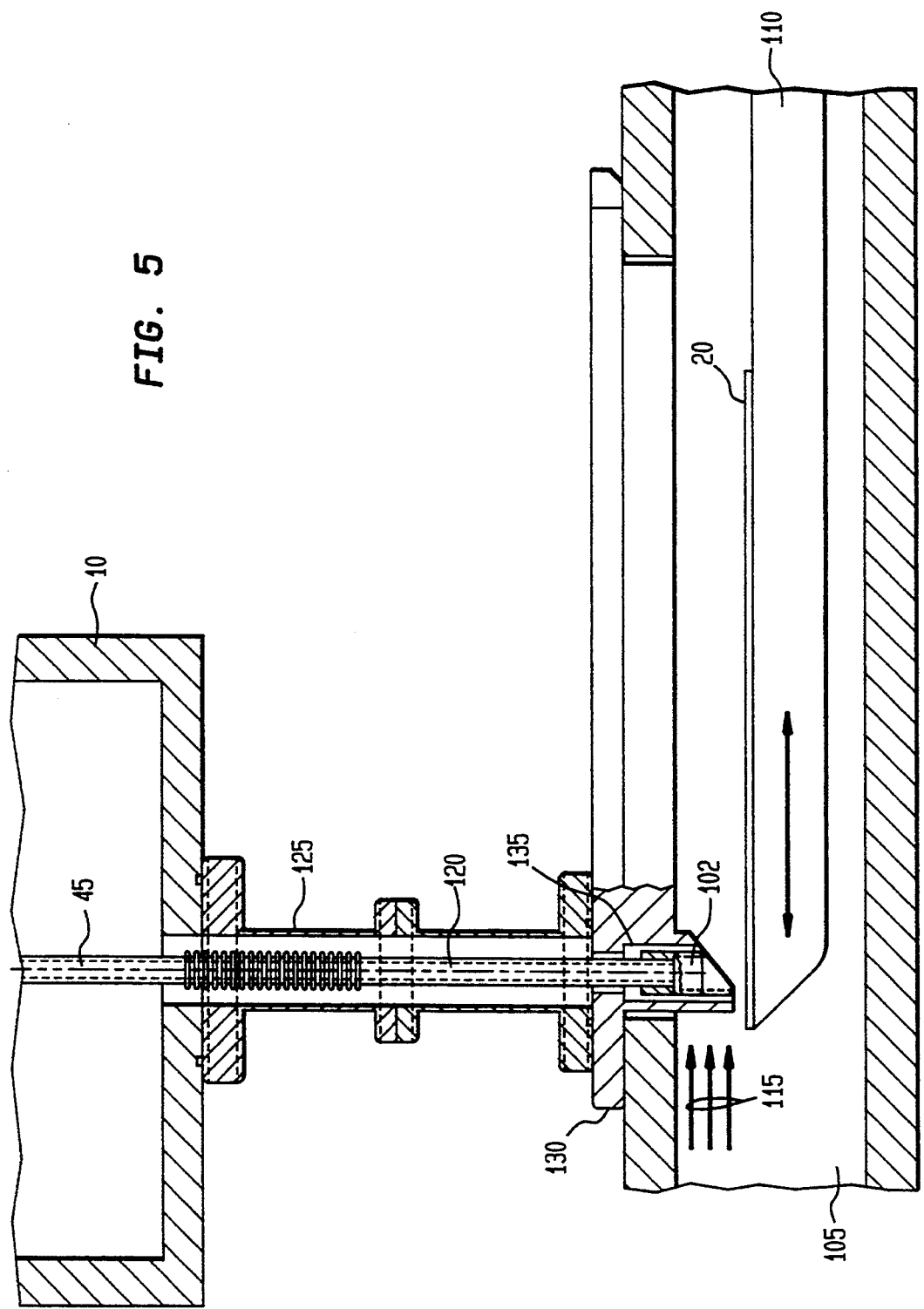
FIG. 5 is a cross-sectional view of one embodiment of an apparatus for cleaning a surface in accordance with the present invention.
Figure 6:
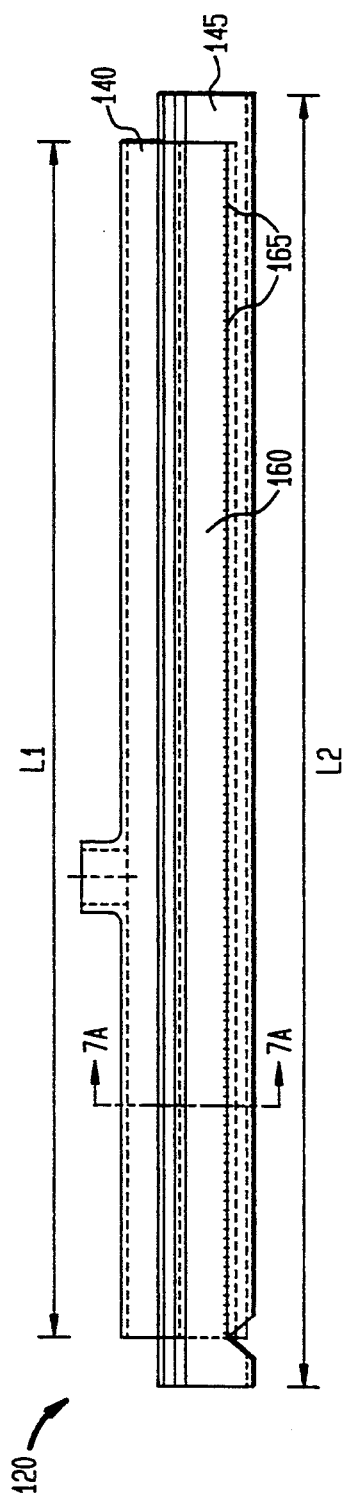
FIG. 6 is a frontal partial cross-sectional view of a nozzle tip in accordance with the present invention.
Figure 7B:
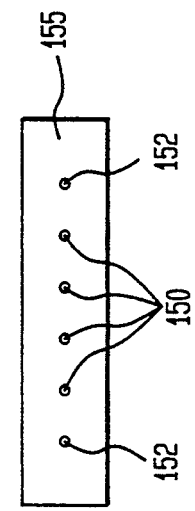
FIGS. 7A-B are different views of the nozzle tip of FIG. 6.
Figure 7A:
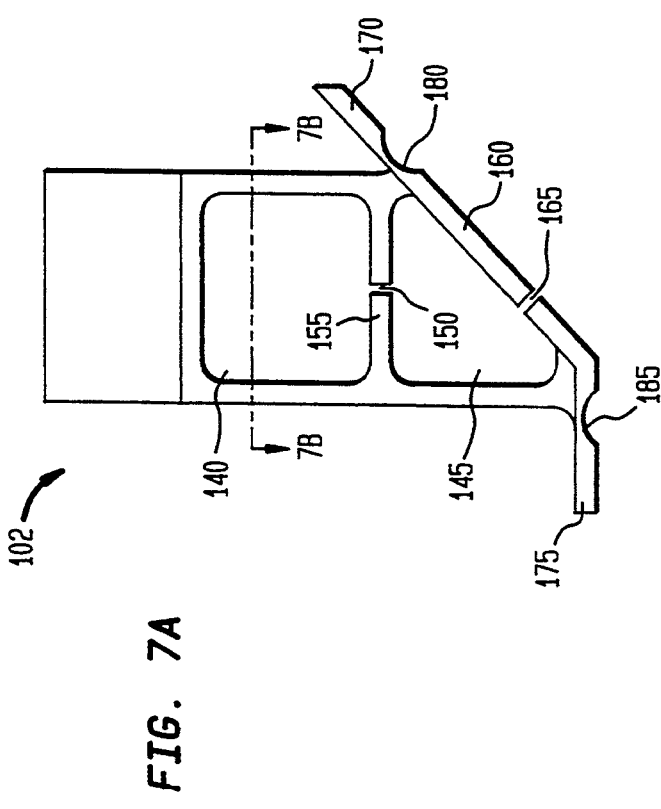
Figure 9:
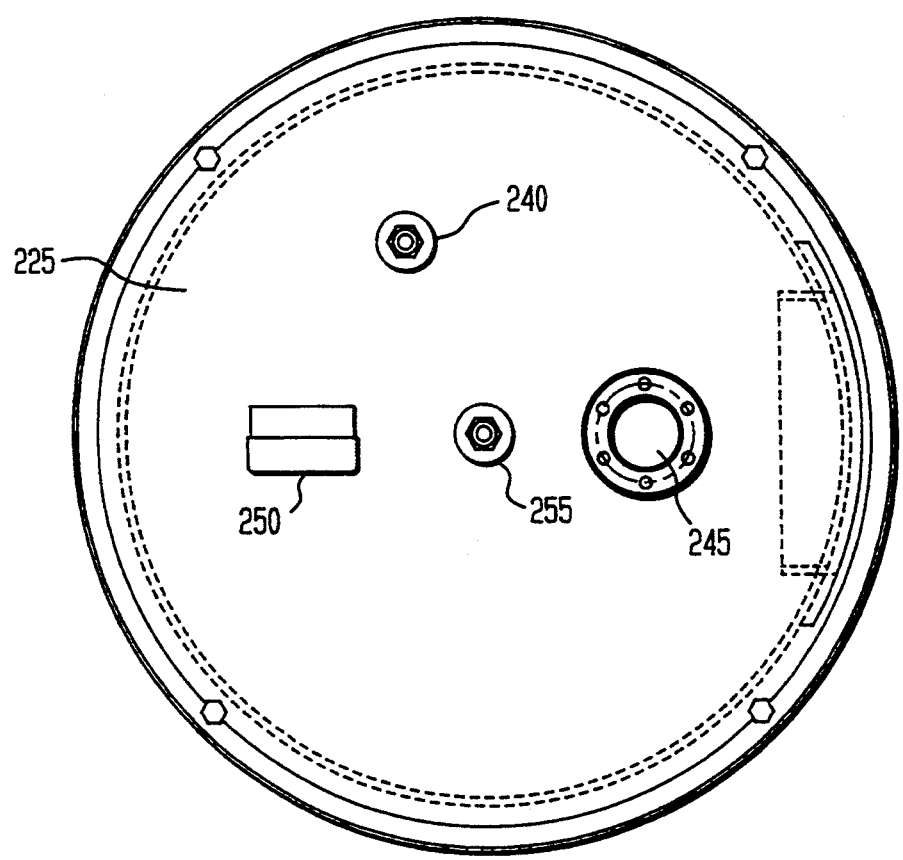
FIG. 9 is a top view of the apparatus of FIG. 8.
Figure 10:
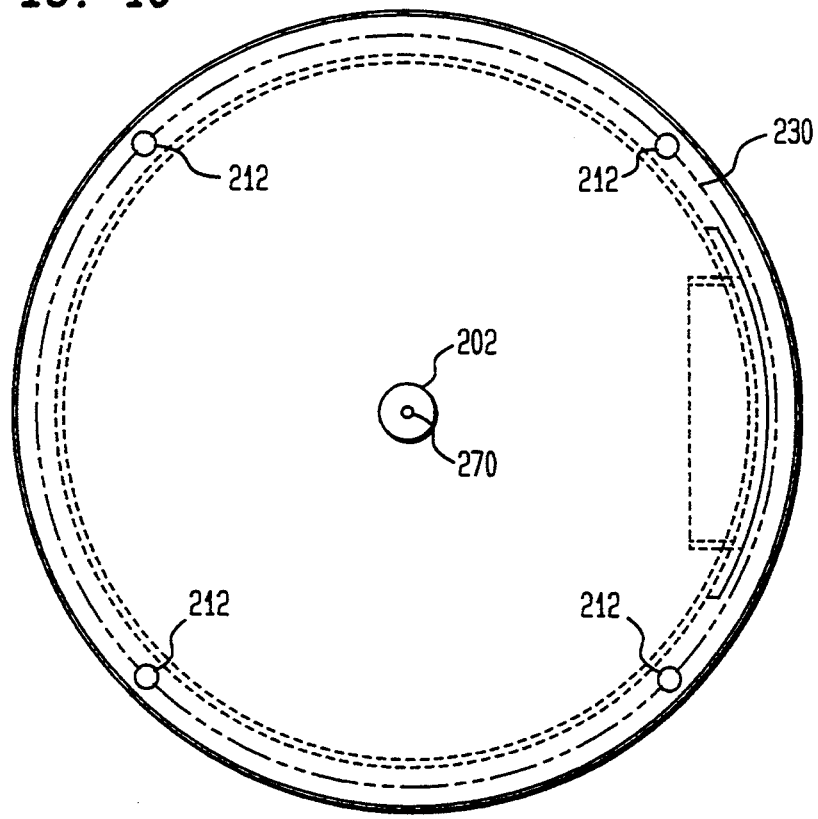
FIG. 10 is a bottom view of the apparatus of FIG. 8.
Figure 12A:
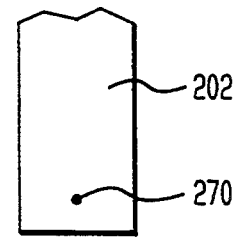
FIG. 12A-C are various illustrative nozzles that can be utilized in accordance with the present invention.
Figure 11:
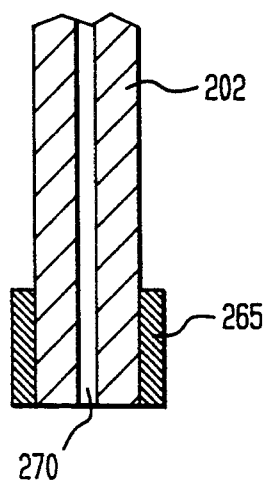
FIG. 11 is a cross-sectional view of a nozzle tip in accordance with the present invention.
Figure 12B:
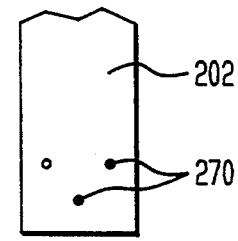
Figure 12C:
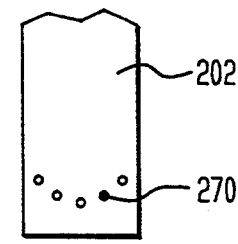

Referring to FIGS. 5-7, in one embodiment, a nozzle apparatus which includes a nozzle 102 is affixedly mounted to a process chamber 105 in which the surface 20 to be cleaned, for example, a wafer, is positioned. The surface 20 can be maneuvered under the nozzle 102 using, for example, a chuck 110 onto which the surface 20 is positioned. Thus, the aerosol being produced is directed at the surface 20 and the surface 20 is cleaned as it is maneuvered under the nozzle 102. Moreover, a curtain or carrier gas of, for example, nitrogen, can be made to flow, as indicated by arrows 115, through the process chamber 105 as the surface 20 is being cleaned. Particles being cleaned off the surface 20 can be carried away by the curtain gas. Further, the curtain gas can function to minimize formation of moisture, ice or impurity condensate on the surface 20 due to the aerosol being directed thereat. Formation of such moisture or ice can cause inadequate cleaning of the surface 20. The surface 20 can also be heated by conventional heating means in order to be kept dry.

As shown, the nozzle 102 is connected to one end of a delivery line 120. The other end of the delivery line 120 is connected to the tubing 45 from the heat exchanger 10; or the other end can be connected directly to a substance supply if the substance does not require cooling prior to delivery to the nozzle 102. The delivery line 120 is contained within a vacuum feedthrough assembly 125. One end of the vacuum feedthrough assembly 125 is mounted to the heat exchanger 10; and the other end of the vacuum feedthrough assembly 125 is mounted to a chamber cover 130 of the process chamber 105. The chamber cover 130 has a nozzle housing 135 which extends into the process chamber 105. Preferably, the vacuum feedthrough assembly 125 is in communication with the heat exchanger 10, and the nozzle housing 135 of the chamber cover 130 is in communication with the vacuum feedthrough assembly 125 such that the vacuum attained within the housing 30 of the heat exchanger 10 can be realized within the vacuum feedthrough assembly 125 and further realized within the nozzle housing 135. Accordingly, the vacuum feedthrough assembly 125 should be mounted and sealed with the housing 30, and the chamber cover 130 of the process chamber 105 should be mounted and sealed with the vacuum feedthrough assembly 125 so that the pump 65 can be used for attaining vacuum within the housing 30, as well as within the assembly 125 and nozzle housing 135. Such mounting and sealing can be accomplished by conventional means and thus will not be further discussed herein. As such, the vacuum level in the vacuum feedthrough assembly 125 and nozzle housing 135 can be maintained approximately equal to the vacuum level in the housing 30, for instance, at approximately $1 \times 10^{-4}$ torr. Providing for vacuum in the vacuum feedthrough assembly 125 and in the nozzle housing 135, so as to insulate and/or isolate the delivery line 120 and the nozzle 102 from atmosphere, allows for the temperature of gas being delivered from the tubing 45 of the heat exchanger 10 to the nozzle 102 via the delivery line 120 to be maintained relatively close to its transition temperature.

Further, providing for vacuum in the vacuum feedthrough assembly 125 and nozzle housing 135 prevents condensation, moisture, or other impurities from forming on the delivery line 120 and/or nozzle 102. Formation of condensation on the line 120 and/or nozzle 102 is detrimental to aerosol production and may cause unstable aerosol jets. If condensation forms after the delivery line 120 and nozzle 102 cool down, the condensation process releases heat and causes the temperature to rise. This temperature rise may prevent gas from being maintained at the desired temperature, and aerosol may thus be prevented from forming. Thus, the process condition may become unstable and/or the process time from standby to operating temperature may be lengthened or operating temperature may become impossible to achieve.

As shown more specifically in FIGS. 6-7, the nozzle 102 includes an upper distribution manifold 140 and a lower distribution manifold 145. The manifolds 140, 145 have dimensions suitable for the particular application. For example, for cleaning 8 inch wafers, the upper distribution manifold 140 can have a length L1 of approximately 8.125 inches, and the lower distribution manifold 145 can have a length L2 of approximately 8,610 inches.

The material chosen to form the manifolds 140, 145 should be able to withstand erosion due to the pressure of the gas passing therethrough, and should be able to withstand the low operating temperatures without fracturing. Other factors to consider in choosing the material may include ease of machining or manufacturability and cost. Material that may be used include ceramic, glass, stainless steel, copper, aluminium, plastics, alloys, etc.

A plurality of balancing openings or holes 150, 152 are provided at the interface 155 between the upper and lower distribution manifolds 140 and 145 so that no low pressure points are generated therein. The balancing holes 150, 152 effectuate even distribution of gas so as to equalize the pressure of the gas being passed from the upper distribution manifold 140 to the lower distribution manifold 145. If a low pressure point was unintentionally generated, the change in pressure may cause the transition temperature of the gas to be altered so that an uneven aerosol is generated downstream of the nozzle 102. The uneven pressure distribution in the nozzle may also cause liquification and/or solidification of the gas inside the nozzle, and thus cause unstable aerosol jets. In order to avoid generation of these low pressure points in manifolds having the lengths specified above, it has been found that a row of about six balancing holes 150, 152, equally spaced apart at a distance of about 1,333 inches on centers from the next adjacent balancing hole 150, 152 is capable of preventing generation of low pressure points. Note that gas being delivered into the nozzle 102 is directed at balancing holes 150, so that these balancing holes 150 realize greater gas pressure than do the balancing holes 152 that are situated closest to the ends of the interface 155. Thus, the balancing holes 150 that realize greater gas pressure are made smaller than the balancing holes 152 that realize less gas pressure. For example, the balancing holes 150, 152 can each have a diameter of between 0.1 inches and 0.25 inches and, as a specific example, balancing holes 150 each have a diameter of about 0.125 inches, and balancing holes 152 each have a diameter of about 0.1875 inches.

For efficiency, the distribution manifolds 140, 145 of the nozzle 102 comprise thin walls, i.e., walls of small cross-sectional area, for example, on the order of about 0.030 inches to 0.05 inches. In this regard, the thin walls allow the distribution manifolds 140, 145 to rapidly cool down to the desired operating temperature. This minimizes the cycle time of the nozzle 102 to go from standby temperature to processing temperature, and also minimizes cooling loss of the gas prior to expansion.

The lower wall 160 of the lower distribution manifold 145 is angled or slanted, and this lower wall 160 includes a row of exit openings 165 through which the aerosol is formed and directed at the surface 20 to be cleaned. The exit openings 165 can be any shape, for example, circular holes or slits. The angle or slant of the lower wall 160 allows for effective cleaning of the surface 20 by directing the aerosol at the surface 20 in a slanted manner. In this regard, the aerosol jet generated from the exit openings 165 is aimed at a 0-90 degree angle, and preferably 45 degree angle, relative to the surface 20. Further, the exit openings 165 should be spaced apart and of a size which allows for overlapping of the gas as it exits therethrough so that the aerosol forms as a solid "curtain" at a predetermined distance from the surface 20. This will ensure that the entire surface 20 is covered and cleaned by the aerosol. Further, the diameter of the exit openings 165 should be adequately small so that there is sufficient expanding of the substance to a lower pressure so that at least a substantial portion of the substance solidifies due to Joule-Thompson cooling of the substance for production of aerosol. In this regard, the diameter of the exit openings 165 is a function of the pressure at which the substance is being delivered to the nozzle 102. The greater the pressure of the delivered substance, the larger the allowable exit openings 165, and vice versa. For example, if argon gas is being delivered at a pressure of about 70 psig, each exit opening 165 can be a hole having a diameter on the order of about 0.005 inches to 0.1 inches. Further, these exit openings 165 can be spaced apart a distance of about 0.0625 inches on centers from the next adjacent exit opening 165, so that about 128 exit openings 165 can be positioned in a lower distribution manifold 145 which has a length of approximately 8.610 inches.

In this embodiment, the nozzle 102 includes mounting segments 170, 175 used for mounting the nozzle 102 to the nozzle housing 135 of the chamber cover 130. The mounting segments 170, 175 can be attached or affixed to the nozzle housing 135 by conventional means, such as by welding. In order to minimize thermal conduction, as best illustrated in FIG. 5, note that the nozzle 102 is supported within the nozzle housing 135 solely by attachment of the mounting segments 170, 175 to the housing 135, and the major surfaces of the nozzle 102 are surrounded in vacuum. Additionally, in order to further minimize thermal conduction, the interfaces 180, 185 between the nozzle 102 and the portions of the mounting segments 170, 175 which are affixed to the housing 135 can be thinned so as to minimize the cross-sectional area of the interfaces 180, 185. Thus, the interfaces 180, 185 function as thermal barriers between the nozzle 102 and the nozzle housing 135. For example, the interfaces 180, 185 can be thinned to a thickness of about 0.005 inches.

In another embodiment, as shown in FIGS. 8-11, a nozzle apparatus with a nozzle 202 is mounted so that the nozzle 202 extends or is suspended from or within a nozzle mounting enclosure, housing or chamber 205 in a maneuverable or movable manner. The nozzle mounting chamber 205 can then be mounted to a tool chamber 210, or any processing equipment, or portion thereof, that needs to be cleaned. The nozzle 202 can then be directed at the tool chamber 210 for cleaning, for example, its interior walls with the aerosol being produced from the nozzle 202. Note that since the nozzle 202 in this embodiment is not affixed to a housing as in the embodiment described above, the nozzle 202 does not require mounting segments and no interface exists between the nozzle 202 and a supporting structure. Accordingly, a thermal barrier, such as the thinned out interfaces 180, 185 described hereinabove, is also not required in this embodiment.

Preferably, at least the sidewall 215 of the nozzle mounting chamber 205 comprises a clear material, such as a clear plastic, so that the interior of the tool chamber 210 being cleaned can be visible to the user, and so that the nozzle apparatus within the nozzle mounting chamber 205 can also be visible to the user. The sidewall 215 is positioned between a cover 225 and a flange 230, which are held together using, for example, four steel rods 235 which extend through the chamber 205 and are affixed to the cover 225 and the flange 230.

The flange 230 can be temporarily and removably mounted to the tool chamber 210 by conventional means, such as using bolts 212. As a specific example, it has been found that the apparatus of the present invention can be mounted to and effectively clean the interior walls of an AME5000 plasma tool chamber, manufactured by Applied Materials, Inc., Santa Clara, Calif.

The nozzle mounting chamber 205 further includes a purge port 240 and an exit port 245. The purge port 240 has a purge gas source 242 connected thereto. The purge gas is introduced into the chamber 205 and prevents formation of condensation or impurities on interior surfaces of the nozzle mounting chamber 205, cover 225, flange 230, tool chamber 210, or on surfaces of components contained therein, including the surface being cleaned. For example, the purge gas should have at least about 99% purity, for instance, the purge gas can comprise a dry nitrogen gas. The exit port 245 connects to an exhaust and/or vacuum pump 247. The purge and exhaust/vacuum are arranged so as to allow for contaminants or particles that are cleaned off of the surfaces of the tool chamber 210 to be removed via the exit port 245 so as to prevent the contaminants or particles from re-contaminating the tool chamber 210. For instance, arranging the purge and exhaust/vacuum so as to establish positive pressure in the chambers 205 and 210 is one technique for accomplishing this task.

A pressure regulator 249 can be added either on the purge line and/or on the exhaust/vacuum. The pressure regulator 249 allows for regulation of pressure within the nozzle mounting chamber 205, and pressure therein can be maintained at a constant whether or not aerosol is being produced. The pressure regulator 249 can be connected to the purge side and/or the exhaust/vacuum side in accordance with the pressure balance design, and is shown herein on the exhaust/vacuum side. Further, a gauge 250 can also be included for allowing monitoring of the pressure within the nozzle mounting chamber 205.

A gas and/or liquid supply to be used for producing aerosol is connected to inlet 255 for delivering to the supply line 260 within the nozzle mounting chamber 205. As above, the specific substance delivered and its form, i.e., gas, liquid, or gas/liquid, depends upon the surface being cleaned and the purity requirements. Generally, other factors to be considered in choosing a substance include damage to the surface caused by the substance, the type of particles being cleaned, the work environment, the availability of the substance, environmental hazards caused by the substance, etc. For instance, carbon dioxide liquid has been found to be effective for cleaning tool chambers. In this regard, carbon dioxide aerosol is preferred for removing deposits of an organic nature.

In accordance with details specified hereinabove, the inlet 255 should be connected to the tubing 45 of the heat exchanger 10 when cooling is required prior to expansion by the nozzle 202, i.e, when producing aerosol from gas, However, in the instance where cryogenic liquid or gas/liquid is used and such cooling is not required, the inlet 255 can be connected directly to the supply of liquid or gas/liquid.

The substance is delivered via the supply line 260 to the nozzle 202 for production of aerosol for cleaning the interior of the tool chamber 210. One end of the supply line 260 is affixed to the cover 225, and the other end of the supply line 260 is connected to the nozzle 202 using conventional means, such as, a stainless steel collar 263 or by welding. Thus, the nozzle 202 is suspended by the supply line 260. The length of the supply line 260 depends on the dimensions of the tool chamber 210 being cleaned, and what areas of the tool chamber 210 require to be accessed by the aerosol. In this regard, as appropriate, the supply line 260 may be of a length which allows the nozzle 202 to extend beyond the flange 230, as shown, or the supply line 260 may be shortened so that the nozzle 202 remains within the nozzle mounting chamber 205.

The nozzle 202 in this embodiment may include a protective coating 265 thereon, and may have only one exit opening 270. The protective coating 265 protects against damaging interior surface of the tool chamber 210 by accidental contact with the nozzle 202, and the protective coating 265 can comprise any suitable material for such purpose, for example, Teflon (a trademark of the DuPont, Co. for polytetrafluoroethylene).

Although the exit opening 270 is illustrated as being located at the end of the nozzle 202, the exit opening 270 can be located anywhere on the nozzle 202 that may be convenient for directing the aerosol for cleaning. For example, the exit opening 270 can also be located on a side of the nozzle 202. Further, although only one exit opening 270 is shown, there can be as many exit openings 270 positioned in the nozzle 202 in any pattern as may be required for adequate cleaning. The quantity of exit openings 270 included depends on the surface area of the surface being cleaned. It has been shown that a single circular opening at the tip of the nozzle 202 having a diameter of about 0.02 inches is capable of producing an aerosol effective for cleaning certain tool chambers. Examples of various exit opening 270 arrangements for the nozzle 202 are illustrated in FIGS. 12A–C. In this regard, the nozzle 202 can be made to be removable and interchangable to suit many cleaning requirements.

If a relatively large quantity of exit openings 270 are required, then the upper and lower distribution manifold arrangement as described hereinabove may be required to be implemented since the problem of low pressure points may develop. Of course, when using only one exit opening 270, the problem of pressure balancing does not exist. Also, as specified above, the dimensions of the exit opening 270 depends on the pressure at which the substance is being delivered, but must be adequately small to allow for proper expansion for aerosol production. Accordingly, the nozzle 202 can be made to be conveniently removable by mounting with conventional screws, pins, clamps, or the like, so that replacement nozzles having variously positioned openings can be interchangably used.

In order for the aerosol to access and clean all contaminated surfaces of the tool chamber 210, means should be provided for maneuvering or manipulating the nozzle 202 for directing the aerosol to such contaminated surfaces. In this regard, the supply line 260 can comprise material which remains adequately flexible during cleaning at the required low temperatures. The supply line 260 can then be maneuvered for directing the nozzle 202 towards surfaces to be cleaned. For instance, plastic and certain metal constructions can be used in the construction of the supply line 260 for achieving the required flexibility. As a specific example, stainless steel braided tubing with an outside diameter of about 0.125 inches has been found to remain sufficiently flexible for producing aerosol from carbon dioxide liquid delivered at room temperature and at a pressure of about 800 psig.

Another means for providing maneuverability comprises a swivel-type joint 264 which connects, for instance, the supply line 260 to the cover 225. The supply line 260 can then be swiveled at the joint 264 for directing the nozzle 202 towards the surfaces to be cleaned.

In order to control maneuvering, conventional automated maneuvering means, such as a robotic arm, can be provided, or manual maneuvering means can also be provided. As shown, for manual operation, the housing 205 can be equipped with an access opening 275 through which, for instance, one or more gloves 222 can be introduced into the nozzle mounting chamber 205. The access opening 275 can have a frame 280 comprising, for example, stainless steel which is adapted for receiving the gloves 222 while maintaining an adequate seal from atmosphere within the nozzle mounting chamber 205. A user's hand is inserted into the gloves 222 for manually maneuvering the nozzle 202. Further, for easier and/or more convenient handling, a nozzle grip 220 can be provided along the supply line 260 at a location before the nozzle 202 for use as a handle. The nozzle grip 220 can comprise, for example, Teflon (a trademark of the DuPont, Co. for polytetrafluoroethylene). For further convenience and safety, a valve 223 can also be provided along the supply line 260 for controlling or regulating delivery of a substance to the nozzle 202.

Figure 13:
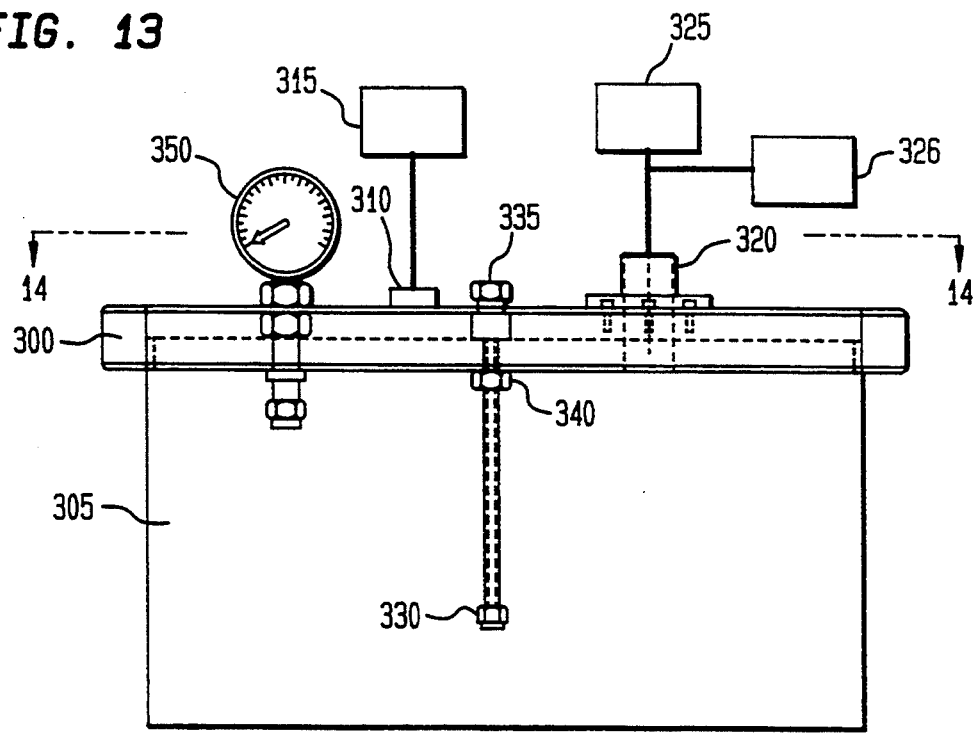
FIG. 13 is a cross-sectional view of a further embodiment of an apparatus for cleaning a surface in accordance with the present invention.
Figure 14:
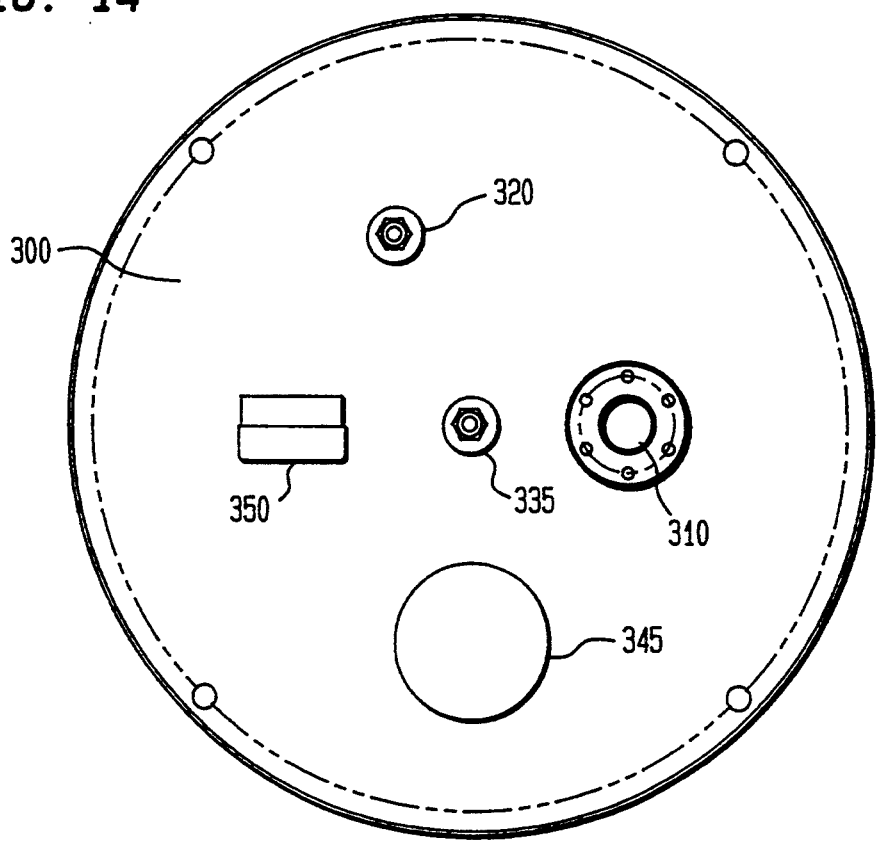
FIG. 14 is a top view of the apparatus of FIG. 13.

Referring now to FIGS. 13-14, in another embodiment of the present invention, a flange 300 is adapted for being directly mounted to a tool chamber 305 for cleaning the tool chamber 305. The flange 300 is conventionally mounted to tool chamber 305, as described above, and can be made to be either permanently mounted or temporarily mounted only during cleaning. As shown, the flange 300 includes a purge port 310 having a purge gas supply 315 connected thereto, and an exit port 320 having an exhaust and/or vacuum pump 325 connected thereto; and a pressure regulator 326 is connected to the exhaust/vacuum line. Further, a nozzle 330 is mounted to the flange 300. The nozzle 330 can be movably/maneuverably mounted or affixedly mounted, and a supply is directly connected to the inlet 335 of the nozzle 330. As above, a swivel-type joint 340 can be provided for connecting the nozzle 330 to the flange 300, and an access opening 345 can be provided in the flange 300 for allowing maneuvering of the nozzle 330. Further, the purge and exhaust/vacuum means provide for positive pressure in the tool chamber 305, and prevent formation of condensation or moisture, or impurities on the tool chamber 305 interior, and prevent re-contamination of the tool chamber 305.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. An apparatus for producing aerosol from a substance, comprising:

a heat exchanger for receiving and cooling a substance, said heat exchanger comprising a housing;

a cryogenic reservoir comprising a solid material mounted within said housing; temperature control means comprising cooling means for controllably cooling said reservoir, and a heat source for heating said reservoir for allowing precise monitoring of temperature; and energy exchange means for allowing thermal contact between said reservoir and the substance for effectuating transfer of cooling energy from said cryogenic reservoir to the substance for controllably cooling the substance;

a delivery line having an inlet for receiving the substance from said heat exchanger at a first pressure;

a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol; and condensation preventing means for preventing condensation from forming on said delivery line and on said nozzle.

2. An apparatus for producing aerosol from a substance, comprising:

a heat exchanger for receiving and cooling a substance, said heat exchanger comprising a housing;

a cryogenic reservoir comprising a solid material mounted within said housing; temperature control means comprising a closed cycle refrigerator capable of delivering 200 Watts of power at 77 degrees K. for controllably cooling said reservoir; and energy exchange means for allowing thermal contact between said reservoir and the substance for effectuating transfer of cooling energy from said cryogenic reservoir to the substance for controllably cooling the substance;

a delivery line having an inlet for receiving the substance from said heat exchanger at a first pressure;

a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol; and condensation preventing means for preventing condensation from forming on said delivery line and on said nozzle.

3. An apparatus for producing aerosol from a substance, comprising:

a heat exchanger for receiving and cooling a substance, said heat exchanger comprising a housing;

a cryogenic reservoir comprising a solid material mounted within said housing; temperature control means for controllably cooling said reservoir; and energy exchange means for allowing thermal contact between said reservoir and the substance for effectuating transfer of cooling energy from said cryogenic reservoir to the substance for controllably cooling the substance;

a delivery line having an inlet for receiving the substance from said heat exchanger at a first pressure;

a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol; and condensation preventing means including purge means for preventing condensation from forming on said delivery line and on said nozzle.

4. An apparatus for producing aerosol from a substance, comprising:

a heat exchanger for receiving and cooling a substance, said heat exchanger comprising a housing; a cryogenic reservoir comprising a solid material mounted within said housing; temperature control means for controllably cooling said reservoir; and energy exchange means for allowing thermal contact between said reservoir and the substance for effectuating transfer of cooling energy from said cryogenic reservoir to the substance for controllably cooling the substance;

a delivery line having an inlet for receiving the substance from said heat exchanger at a first pressure;

a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol, and said nozzle including mounting means for mounting said nozzle to a support structure, said mounting means having an interface between said nozzle and said support structure; and condensation preventing means for preventing condensation from forming on said delivery line and on said nozzle.

5. An apparatus for producing aerosol from a substance, comprising:

a heat exchanger for receiving and cooling a substance, said heat exchanger comprising a housing;

a cryogenic reservoir comprising a solid material mounted within said housing; temperature control means for controllably cooling said reservoir; and energy exchange means for allowing thermal contact between said reservoir and the substance for effectuating transfer of cooling energy from said cryogenic reservoir to the substance for controllably cooling the substance;

a delivery line having an inlet for receiving the substance from said heat exchanger at a first pressure;

a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol, and said nozzle comprising pressure balancing means for balancing pressure therein so that no low pressure points exist therein; and condensation preventing means for preventing condensation from forming on said delivery line and on said nozzle.

6. An apparatus according to claim 1 or 2 or 3 or 4 or 5, wherein the substance is a gas and the energy transferred from the reservoir to the gas cools the gas to a temperature within about 5°-20 degrees F. above its gas to liquid or solid transition temperature.

7. An apparatus according to claim 1 or 2 or 3 or 4 or 5, further comprising insulation means.

8. An apparatus according to claim 1 or 2 or 3 or 4 or 5, wherein said energy exchange means comprises tubing.

9. An apparatus according to claim 1 or 2 or 3 or 4 or 5, wherein said exit opening is a circular hole.

10. An apparatus according to claim 1 or 2 or 3 or 4 or 5, wherein said condensation preventing means insulates said delivery line.

11. An apparatus according to claim 4, further comprising a thermal barrier for minimizing thermal conduction between the nozzle and the support structure.

12. An apparatus according to claim 1 or 2 or 3 or 4 or 5, wherein said nozzle comprises walls of small cross-sectional area.

13. An apparatus according to claim 5, wherein said pressure balancing means comprises an upper distribution manifold and an lower distribution manifold, wherein an interface between the upper distribution manifold and the lower distribution manifold has balancing openings which allows for passing of gas therethrough, said lower distribution manifold having said at least one exit opening therein.

14. An apparatus according to claim 6, wherein said cryogenic reservoir and the substance are cooled to a temperature of between about −190 degrees F. and −300 degrees F.

15. An apparatus according to claim 7, wherein said insulation means comprises layers of insulating material and vacuum insulation means.

16. An apparatus according to claim 15, wherein said layers of insulating material surround said housing.

17. An apparatus according to claim 15, wherein said vacuum insulation means comprises a pump mounted to said housing.

18. An apparatus according to claim 7, wherein said insulation means comprises layers of insulating material.

19. An apparatus according to claim 18, wherein said layers of insulating material surround said housing.

20. An apparatus according to claim 7, wherein said insulation means comprises vacuum insulation means.

21. An apparatus according to claim 20, wherein said vacuum insulation means comprises a pump mounted to said housing.

22. An apparatus according to claim 8, wherein said tubing comprises stainless steel.

23. An apparatus according to claim 9, wherein said hole has a diameter of about 0.005 inches and 0.1 inches.

24. An apparatus according to claim 23, wherein said exit opening is a plurality of holes each spaced apart a distance of about 0.0625 inches on centers from the next adjacent hole.

25. An apparatus according to claim 10, wherein said condensation preventing means includes vacuum insulation.

26. An apparatus according to claim 30, wherein said condensation preventing means includes vacuum insulation.

27. An apparatus according to claim 12, wherein said walls have a thickness on the order of between about 0.03 inches and 0.05 inches.

28. An apparatus according to claim 1 or 2 or 3 or 4 or 5, wherein said reservoir comprises copper.

29. An apparatus according to claim 1 or 2 or 3 or 4 or 5, wherein said condensation preventing means includes vacuum means for isolating said delivery line and said nozzle in vacuum.

30. An apparatus according to claim 1 or 2 or 3 or 4 or 5, wherein said condensation preventing means insulates said nozzle.

31. An apparatus according to claim 11, wherein said thermal barrier comprises walls of small cross-sectional area.

32. An apparatus according to claim 31, wherein said walls have a thickness on the order of about 0.005 inches.

33. An apparatus according to claim 13, wherein said balancing openings are holes having a diameter of about 0.1 inches and 0.25 inches.

34. An apparatus according to claim 33, wherein said holes are in a row and spaced apart a distance of about 1.333 inches on centers from the next adjacent hole.

35. An apparatus for producing aerosol from a substance, comprising:
    a heat exchanger for receiving and cooling a substance, said heat exchanger comprising a housing;
    a cryogenic reservoir comprising a solid material mounted within said housing; temperature control means for controllably cooling said reservoir; and energy exchange means for allowing thermal contact between said reservoir and the substance for effectuating transfer of cooling energy from said cryogenic reservoir to the substance for controllably cooling the substance;
    a delivery line having an inlet for receiving the substance from said heat exchanger at a first pressure;
    a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol;
    condensation preventing means for preventing condensation from forming on said delivery line and on said nozzle; and
    vacuum insulation means for insulating said housing, said vacuum insulation means comprising a pump mounted to said housing on a 90 degree elbow.

36. An apparatus for producing aerosol from a substance, comprising:
    a heat exchanger for receiving and cooling a substance, said heat exchanger comprising a housing;
    a cryogenic reservoir comprising a solid material mounted within said housing; temperature control means for controllably cooling said reservoir; and energy exchange means for allowing thermal contact between said reservoir and the substance for effectuating transfer of cooling energy from said cryogenic reservoir to the substance for controllably cooling the substance;
    a delivery line having an inlet for receiving the substance from said heat exchanger at a first pressure;
    a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol;
    condensation preventing means for preventing condensation from forming on said delivery line and on said nozzle; and
    insulation means for insulating said housing, said insulating means comprising layers of insulating material and vacuum insulation means, said vacuum insulation means comprising a pump mounted to said housing on a 90 degree elbow.

37. An apparatus for producing aerosol from a substance, comprising:
    a heat exchanger for receiving and cooling a substance, said heat exchanger comprising a housing; a cryogenic reservoir comprising a solid material mounted within said housing; temperature control means for controllably cooling said reservoir; and energy exchange means comprising stainless steel tubing brazed to said reservoir for allowing thermal contact between said reservoir and the substance for effectuating transfer of cooling energy from said cryogenic reservoir to the substance for controllably cooling the substance;
    a delivery line having an inlet for receiving the substance from said heat exchanger at a first pressure;
    a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol; and
    condensation preventing means for preventing condensation from forming on said delivery line and on said nozzle.

38. An apparatus for producing aerosol from a substance, comprising:
    a heat exchanger for receiving and cooling a substance, said heat exchanger comprising a housing;
    a cryogenic reservoir comprising a solid material mounted within said housing, said reservoir including a groove; temperature control means for controllably cooling said reservoir; and energy exchange means comprising tubing received in said groove for allowing thermal contact between said reservoir and the substance for effectuating transfer of cooling energy from said cryogenic reservoir to the substance for controllably cooling the substance;
    a delivery line having an inlet for receiving the substance from said heat exchanger at a first pressure;
    a nozzle connected to said delivery line for receiving the substance from said delivery line, said nozzle having at least one exit opening which allows passing of the substance therethrough for expanding the substance from the first pressure to a second pressure which is lower than the first pressure for solidifying the substance and producing aerosol; and
    condensation preventing means for preventing condensation from forming on said delivery line and/or on said nozzle.

* * * * *